United States Patent
Roziere et al.

(10) Patent No.: US 9,939,956 B2
(45) Date of Patent: Apr. 10, 2018

(54) CAPACITIVE SENSING DEVICE COMPRISING PERFORATED ELECTRODES

(71) Applicant: QuickStep Technologies LLC, Wilmington, DE (US)

(72) Inventors: Didier Roziere, Nimes (FR); Christian Neel, Nimes (FR); Christophe Blondin, Valleiry (FR)

(73) Assignee: QUICKSTEP TECHNOLOGIES LLC, Wilmington, DE (US)

( * ) Notice: Subject to any disclaimer, the term of this patent is extended or adjusted under 35 U.S.C. 154(b) by 0 days.

(21) Appl. No.: 14/927,379

(22) Filed: Oct. 29, 2015

(65) Prior Publication Data

US 2016/0357338 A1 Dec. 8, 2016

(30) Foreign Application Priority Data

Oct. 29, 2014 (FR) ..................... 14 60380

(51) Int. Cl.
*G06F 3/041* (2006.01)
*G06F 3/044* (2006.01)
(Continued)

(52) U.S. Cl.
CPC ............ *G06F 3/0418* (2013.01); *G06F 3/044* (2013.01); *H03K 17/955* (2013.01);
(Continued)

(58) Field of Classification Search
CPC . G06F 2203/04107; G06F 2203/04108; G06F 3/0418; G06F 3/044; H03K 17/955;
(Continued)

(56) References Cited

U.S. PATENT DOCUMENTS 3,743,865 A * 7/1973 Riechmann .......... H03K 17/955
307/116
5,483,261 A 1/1996 Yasutake
(Continued)

FOREIGN PATENT DOCUMENTS

CN 102 455 831 A 5/2012
CN 204 102 115 U 1/2015
(Continued)

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
(Continued)

*Primary Examiner* — Tony Davis
(74) *Attorney, Agent, or Firm* — Morrison & Foerster LLP

(57) ABSTRACT

This invention relates to a capacitive sensing device comprising (i) at least one capacitive electrode (12) with a substantially conductive material arranged so as to form a conductive surface (51); (ii) at least one guard component placed close to said at least one capacitive electrode (12); said capacitive electrode(s) (12) comprises(comprise) at least one opening (52) without conductive material arranged within or on the edge of the conductive surface (51) so as to reduce the coupling capacitance between said capacitive electrode(s) (12) and said guard component(s).
The invention also relates to an apparatus implementing the device.

17 Claims, 2 Drawing Sheets

(51) Int. Cl.
  *H03K 17/955* (2006.01)
  *H03K 17/96* (2006.01)
(52) U.S. Cl.
  CPC .......... *H03K 17/9622* (2013.01); *G06F 2203/04107* (2013.01); *G06F 2203/04108* (2013.01); *H03K 2017/9602* (2013.01); *H03K 2217/960765* (2013.01)
(58) Field of Classification Search
  CPC ....... H03K 17/9622; H03K 2017/9602; H03K 2217/960765
  USPC .......................................................... 324/688
  See application file for complete search history.

(56) References Cited

U.S. PATENT DOCUMENTS

| | | | |
|---|---|---|---|
| 5,488,204 A | 1/1996 | Mead et al. | |
| 5,546,005 A * | 8/1996 | Rauchwerger | G01F 23/268 324/664 |
| 5,757,196 A * | 5/1998 | Wetzel | H03K 17/955 307/116 |
| 5,825,352 A | 10/1998 | Bisset et al. | |
| 5,835,079 A | 11/1998 | Shieh | |
| 5,844,506 A | 12/1998 | Binstead | |
| 5,862,248 A | 1/1999 | Salatino et al. | |
| 5,877,424 A * | 3/1999 | Hegner | G01L 19/00 361/283.4 |
| 5,880,411 A | 3/1999 | Gillespie et al. | |
| 5,956,415 A | 9/1999 | McCalley et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,593,755 B1 * | 7/2003 | Rosengren | H03K 17/955 324/662 |
| 6,690,387 B2 | 2/2004 | Zimmerman et al. | |
| 6,847,354 B2 | 1/2005 | Vranish | |
| 7,005,864 B2 * | 2/2006 | Iannello | G01D 3/02 324/632 |
| 7,015,894 B2 | 3/2006 | Morohoshi | |
| 7,119,554 B2 * | 10/2006 | Nakamura | G01D 5/24 324/681 |
| 7,184,064 B2 | 2/2007 | Zimmerman et al. | |
| 7,301,350 B2 * | 11/2007 | Hargreaves | G01R 27/2605 324/678 |
| 7,570,064 B2 | 8/2009 | Roziere | |
| 7,663,607 B2 | 2/2010 | Hotelling et al. | |
| 8,149,002 B2 | 4/2012 | Ossart et al. | |
| 8,159,213 B2 | 4/2012 | Roziere | |
| 8,479,122 B2 | 7/2013 | Hotelling et al. | |
| 8,659,407 B2 * | 2/2014 | Merkel | G01B 7/023 324/662 |
| 8,770,033 B2 | 7/2014 | Roziere | |
| 8,917,256 B2 | 12/2014 | Roziere | |
| 9,035,903 B2 | 5/2015 | Binstead | |
| 9,535,547 B2 * | 1/2017 | Roziere | G06F 3/044 |
| 9,581,628 B2 * | 2/2017 | Setlak | G01R 27/2605 |
| 2006/0038642 A1 * | 2/2006 | Goins | H01G 5/18 335/78 |
| 2006/0097733 A1 | 5/2006 | Roziere | |
| 2006/0197753 A1 | 9/2006 | Hotelling | |
| 2006/0284639 A1 * | 12/2006 | Reynolds | G01D 5/24 324/688 |
| 2007/0138587 A1 * | 6/2007 | Shin | H01L 23/5223 257/435 |
| 2007/0222021 A1 * | 9/2007 | Yao | H01L 23/481 257/499 |
| 2008/0231292 A1 * | 9/2008 | Ossart | G01B 7/08 324/688 |
| 2008/0284261 A1 | 11/2008 | Andrieux et al. | |
| 2008/0297675 A1 * | 12/2008 | Kim | G02F 1/136213 349/38 |
| 2010/0011877 A1 * | 1/2010 | Izumi | G01F 1/586 73/861.12 |
| 2010/0052700 A1 | 3/2010 | Yano et al. | |
| 2010/0259283 A1 * | 10/2010 | Togura | H03K 17/955 324/679 |
| 2011/0001549 A1 * | 1/2011 | Van Gastel | H03K 17/955 327/517 |
| 2011/0007030 A1 | 1/2011 | Mo et al. | |
| 2011/0169783 A1 | 7/2011 | Wang et al. | |
| 2012/0044662 A1 | 2/2012 | Kim et al. | |
| 2012/0050203 A1 | 3/2012 | Osoinach et al. | |
| 2012/0161793 A1 * | 6/2012 | Satake | B60N 2/002 324/658 |
| 2012/0169652 A1 | 7/2012 | Chang | |
| 2012/0187965 A1 * | 7/2012 | Roziere | G06F 3/044 324/688 |
| 2012/0188200 A1 | 7/2012 | Roziere | |
| 2012/0229414 A1 | 9/2012 | Ellis | |
| 2012/0289022 A1 * | 11/2012 | Kiehlbauch | H01L 28/91 438/396 |
| 2013/0033469 A1 * | 2/2013 | Itoh | G02F 1/136286 345/204 |
| 2013/0135247 A1 | 5/2013 | Na et al. | |
| 2013/0162596 A1 | 6/2013 | Kono et al. | |
| 2013/0307776 A1 | 11/2013 | Roziere | |
| 2014/0132335 A1 | 5/2014 | Rauhala et al. | |
| 2014/0267165 A1 * | 9/2014 | Roziere | G06F 3/044 345/174 |
| 2014/0360854 A1 * | 12/2014 | Roziere | G06F 3/0412 200/5 R |
| 2015/0029144 A1 | 1/2015 | Jo et al. | |
| 2015/0035792 A1 * | 2/2015 | Roziere | G06F 3/0418 345/174 |
| 2015/0040667 A1 * | 2/2015 | Tanaka | G01P 15/125 73/514.32 |
| 2015/0048850 A1 * | 2/2015 | Neel | G06F 3/0418 324/679 |
| 2015/0068897 A1 * | 3/2015 | Neel | G06F 3/044 204/407 |
| 2016/0034102 A1 * | 2/2016 | Roziere | G06F 3/044 345/174 |
| 2016/0054813 A1 * | 2/2016 | Schediwy | G06F 3/0338 345/161 |
| 2016/0179247 A1 * | 6/2016 | Blondin | G06F 1/1626 345/174 |
| 2016/0188038 A1 * | 6/2016 | Roziere | G06F 3/0416 345/174 |
| 2016/0291730 A1 * | 10/2016 | Roziere | G06F 1/1656 |
| 2016/0322351 A1 * | 11/2016 | Moens | H01L 29/747 |
| 2016/0357338 A1 * | 12/2016 | Roziere | G06F 3/044 |
| 2017/0068352 A1 * | 3/2017 | Blondin | G04G 21/08 |
| 2017/0108968 A1 * | 4/2017 | Roziere | G06F 3/044 |
| 2017/0108978 A1 * | 4/2017 | Blondin | G06F 3/0416 |
| 2017/0220156 A1 * | 8/2017 | Blondin | G06F 3/044 428/68 |

FOREIGN PATENT DOCUMENTS

| | | |
|---|---|---|
| EP | 2 096 526 A2 | 9/2009 |
| EP | 2 267 791 A2 | 10/2010 |
| FR | 2 949 007 A1 | 2/2011 |
| FR | 2 971 867 A1 | 8/2012 |
| JP | S-63 6829 Y2 | 2/1988 |
| JP | 2000-163031 A | 6/2000 |
| JP | 2002-342033 A | 11/2002 |
| WO | WO-2013/120071 A1 | 8/2013 |
| WO | WO-2014/076708 A2 | 5/2014 |
| WO | WO-2014/076708 A3 | 5/2014 |
| WO | WO-2014/183932 A1 | 11/2014 |
| WO | WO-2014/188057 A1 | 11/2014 |
| WO | WO-2015/101700 A1 | 7/2015 |
| WO | WO-2016/067097 A1 | 5/2016 |
| WO | WO-2016/126893 A1 | 8/2016 |

OTHER PUBLICATIONS

Rubine, D.H. (Dec. 1991). "The Automatic Recognition of Gestures," CMU-CS-91-202, Submitted in Partial Fulfillment of the

(56) References Cited

OTHER PUBLICATIONS

Requirements for the Degree of Doctor of Philosophy in Computer Science at Carnegie Mellon University, 285 pages.

Rubine, D.H. (May 1992). "Combining Gestures and Direct Manipulation," CHI ' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Anonymous. (Aug. 7, 2017). "Indium tin oxide—Wikipedia", Mar. 29, 2013 (Mar. 29, 2013), XP055396619, Extrait de !'Internet: URL:https://en.wikipedia.org/w/index.php?title=lndium_tin_oxide&oldid=547596433[extrait le, five pages.

International Search Report dated Jun. 26, 2014 for PCT Application No. PCT/EP2014/057161, six pages.

International Search Report dated Apr. 11, 2016, for PCT Application No. PCT/US2016/016472, six pages.

Non-Final Office Action dated Jul. 25, 2017, for U.S. Appl. No. 14/891,958, filed Mar. 15, 2016, eight pages.

\* cited by examiner

CAPACITIVE SENSING DEVICE COMPRISING PERFORATED ELECTRODES

TECHNICAL DOMAIN

This invention relates to a capacitive sensing device for measurement and sensing applications, or for obtaining touch and contactless interfaces.

The field of the invention is more specifically, but not limited to, capacitive measurement systems.

DESCRIPTION OF THE PRIOR ART

Capacitive sensing techniques are widely used in a variety of applications, for example in the fields of industrial measurement, collision sensing systems, or touch and contactless man-machine interfaces.

Capacitive sensors used to perform proximity measures (for example, in collision sensing applications) and those used in the most performing touch and contactless man-machine interfaces generally implement the principle of direct measurement of coupling capabilities ("self" mode). This measurement principle is based on measuring the capacitance created between each electrode constituting the sensor and the object(s) of interest to be sensed.

The best performing sensors in terms of early or long-range sensing are equipped with a guard, known as an active guard, which prevents the occurrence of stray capacitances due to parasitic coupling between electrodes and their environment. This active guard is biased at the same electrical voltage as the measuring electrodes. Thus, it is possible to measure absolute capacitances between electrodes and the objects of interest (without interference from stray capacitances) and to infer absolute sensor-object distances with optimal sensitivity.

The conversion of the measuring ability into an electrical signal is frequently performed using an arrangement such as a charge amplifier or capacitance-voltage transformer. Indeed this type of arrangement is a high-performance solution in terms of measurement and simplicity of the circuit.

WO2004/023067 is known to disclose a proximity sensor intended to equip, for example, medical imaging devices with moving components for detecting the presence and position of a patient and thus adapt the movement of the equipment accordingly. The sensitive components consist of arrays of capacitive electrodes with their rear side protected by a guard plane.

WO2011/015794 is also known to disclose a control interface device to be used as a man-machine interface which detects contact and distant movements. The device comprises a sensitive surface consisting of an array of capacitive electrodes with their rear side protected by a guard plane. The electrodes and the guard may be transparent and superimposed on a display screen to provide a touch screen capable of also sensing nearby gestures.

In the examples cited above, the electrodes are energized at an alternating current energizing voltage, and the guard is biased to a guard voltage substantially identical to this energizing voltage. As the objects to be sensed are at a ground voltage, it is therefore possible to measure the capacitance established between electrodes and these objects. The guard planes at the electrodes' voltage prevent the occurrence of stray capacitances between measuring electrodes and other components at ground voltage.

In addition, in both examples the electronic sensing components partially use the guard voltage as a reference (at least in the case of the sensitive parts used for measuring) to also cancel stray capacitances at component level.

WO2011/015795 is also known to disclose a capacitive sensing device with active guard, wherein the guarding principle is extended to the electronic means placed close to electrodes and designed to perform a different function. Thus, these other electronic means do not generate stray capacitances.

In the examples cited above, the sensing input stage may be represented by an equivalent circuit with a charge amplifier based on an operational amplifier. The measuring electrode is connected to the (−) terminal of said operational amplifier, while the guard components are connected to its (+) terminal.

Even if these components are at the same voltage, they are capacitively coupled with one another. This coupling may be modeled by a parasitic coupling capacitance $C_p$ placed between the (+) and (−) terminals of the charge amplifier.

This parasitic coupling capacitance $C_p$ affects the noise performance of the charge amplifier, as well as its consumption. In particular, it generates an intrinsic voltage noise gain for the amplifier and degrades its open-loop gain. Parasitic coupling capacitances $C_p$ that are too high may cause saturation issues to the charge amplifier.

However, in applications such as proximity sensors it is necessary to use electrodes of large dimensions in order to have sensing ranges of several tens of centimeters. The electrode surface areas facing the guard are thus sizable and the resultant parasitic coupling capacitances may be problematic.

In touch interface-type applications with electrode arrays superimposed on display screens, it is necessary to minimize the distance between electrodes and the guard plane to minimize the thickness of the touchscreen. Under these conditions, the resulting parasitic coupling capacitances may also be problematic, especially since it is essential to minimize power use for this type of application.

When the capacitive electrodes are integrated into the constituent layers of the display screen ("in-cell"-type technologies) and/or located near components with guard voltage, there is also a risk of excessive parasitic coupling capacitances.

The object of this invention is to allow electrode-guard coupling capacitances to be restricted in capacitive sensing devices with active guard.

Another object of this invention is to allow electrodes of large dimensions to be used without degrading the measurement performance of such devices.

Another object of this invention is to allow the use of active guard components at a very close distance from the measuring electrodes without degrading measurement performance.

DISCLOSURE OF THE INVENTION

This object is achieved with a capacitive sensing device comprising:
- at least one capacitive electrode with a substantially conductive material arranged so as to form a conductive surface;
- at least one guard component placed close to said at least one capacitive electrode;
- characterized in that said capacitive electrode(s) comprises(comprise) at least one opening without conductive material arranged within or on the edge of the conductive surface so as to reduce the coupling capacitance between said capacitive electrode(s) and said guard component(s).

Thus, the capacitive electrodes according to the invention comprise a conductive surface with one or a plurality of openings. These "openings" refer to areas in the conductive surface layer that are devoid of conductive material. These may be holes, i.e., areas in the vicinity of conductive material, or notches or yet indentations on the edges of the conductive surface.

The function of these openings is to reduce the area of the conductive surface without substantially reducing its external dimensions. These external dimensions may, for example, be represented by the greater extension or the average extension of the conductive surface along the reference axes of a reference point on the plane of this conductive surface.

The outer dimensions of the conductive surface determine an effective dimension and effective surface of the capacitive electrode, which mainly affect the interactions of this electrode with its environment. In fact, they essentially determine its coupling diagram with the environment, or in other words the structure of the field lines that may be created between the electrode and objects nearby.

In the case of a periodic electrode structure (such as a line or an array of electrodes), the effective dimensions of the electrode together with the structure pitch (i.e., the distance between the centers of consecutive electrodes in the structure in the direction under consideration) determine the linearity of the movement measurement of an object. For example, for a given structure pitch value, the movement measurement of a small object in front of this pitch may show stair-step effects that are much more marked with electrodes of small dimensions than with those of large dimensions.

The area of the conductive surface basically determines the parasitic coupling capacitance that may occur with a guard component or surface positioned nearby.

This way, the invention allows to reduce or control the distribution of this parasitic coupling capacitance without significantly affecting the effective dimensions of the electrode and therefore, for example, without affecting the linearity of the measurement of a periodic electrode structure.

In other words, the invention makes it possible to separately adjust the coupling capacitance of the electrode and its effective dimensions.

In one aspect of the invention, the capacitive sensor according to the invention may comprise at least one guard component designed as a conductive guard surface with at least one opening without conductive material, arranged within or on the edge of said conductive guard surface facing at least one capacitive electrode, so as to reduce the coupling capacitance between said capacitive electrode(s) and said guard component(s).

In this aspect, depending on the particular embodiment:
the capacitive electrodes may have no opening without conductive material within or on the edge of the conductive surface;
the capacitive electrodes may comprise openings without conductive material within or on the edge of the conductive surface;
the capacitive electrodes may comprise openings without conductive material within or on the edge of the conductive surface designed so as to be substantially vis-à-vis the openings without conductive material arranged within the conductive guard surface(s). This configuration serves to limit stray capacitances through the guard.

It should be noted, however, that this aspect is less favorable as it amounts to degrading the guard and generating stray capacitances. Nevertheless, it allows for example the implementation of guard components in lattice form.

Depending on the particular embodiment, the device according to the invention may comprise at least one capacitive electrode having at least one opening arranged so as to reduce the coupling capacitance by at least one of the following factors:
a factor greater than or equal to 1.5;
a factor greater than or equal to 2;

This reduction in the coupling capacitance is obviously obtained by reducing the area of the conductive surface in the vicinity of the guard component(s) under consideration, by taking into account, as needed, the distance to the guard component(s).

Depending on the particular embodiment, the device according to the invention may comprise at least one capacitive electrode with a conductive surface geometrically inscribed in an effective electrode surface area with a contour of at least one of the following types: a convex hull, a convex polygon, a parallelogram, an ellipse or a circle.

As explained above, the effective electrode surface area and its contour are thus the representative elements of the effective dimensions of the electrode.

The conductive surface is known as "geometrically inscribed" in the effective electrode surface area to the extent that it is included in this electrode surface area and its outline is at least partially superimposed on or tangent with the contour of the effective electrode surface area.

A convex hull or a convex polynomial are geometric surfaces whose contour has no "dents". In the case of a convex polynomial, this condition is fulfilled if the angles between the segments are all inferior to 180 degrees.

Depending on the particular embodiment, the device according to the invention may comprise at least one capacitive electrode with a conductive surface whose area satisfies at least one of the following criteria:
the conductive surface area is less than the effective electrode surface area;
the conductive surface area is less than a factor equal to or greater than 1.5 times the effective electrode surface area;
the conductive surface area is less than a factor equal to or greater than 2 times the effective electrode surface area;

Depending on the particular embodiment, the device according to the invention may comprise at least one capacitive electrode with openings arranged within or on the periphery of the conductive surface so that at least one of the following criteria is satisfied:
the surface density of the openings is substantially homogeneous;
the surface density of the openings depends locally on the distance to one or more guard components located nearby.
the surface density of the openings is higher toward the edges of the conductive surface than toward its center;
the average charge density on the surface of the electrode, as resulting from a capacitive coupling with a measurement object in the vicinity, is substantially homogeneous.

The surface density of the openings is defined as the ratio, in a given neighborhood, between the area of the conductive surface present in this neighborhood and the cumulative area of the openings in the conductive material that are also present in this neighborhood.

Implementing a surface density of openings that locally depends on the distance to one or more guard components located nearby allows, for example, to effectively limit the parasitic coupling capacitance while minimizing the conductive (electrode) surface area lost, by positioning the openings preferably close to those guard components with the largest contribution to the coupling capacitance.

Implementing a surface density of openings that is higher toward the edges of the conductive surface than toward its center allows in particular to linearize and homogenize an electrode measurement transfer function with respect to the position (projected in the plane of the electrode) of an object by correcting the fact that electric charges tend to concentrate on the edges of the conductive surface of the electrode.

Depending on the particular embodiment, the device according to the invention may comprise at least one capacitive electrode having at least one opening of one of the following shapes: circular, oblong, square or rectangular.

Other opening shapes are obviously also possible within the scope of the invention.

When the conductive surface is obtained using planar techniques, such as an ITO (indium tin oxide) deposit for transparent electrodes, or the photoetching of metalized layers for opaque electrodes, these openings may be obtained for example by masking.

Depending on the particular embodiment, the device according to the invention may comprise at least one capacitive electrode with a conductive surface arranged in lattice form.

This lattice may comprise for example a network of metallic wires and micro-wires. In this case, the surface density of openings is determined by a local ratio between the area covered by the conductive components (wires) and the area devoid of such components.

This lattice may also be obtained by planar techniques.

Depending on the particular embodiment, the device according to the invention may comprise a plurality of capacitive electrodes distributed on at least one measurement surface.

These electrodes may be distributed for example in a matrix arrangement in a plane corresponding to a measurement surface. They may also be distributed in the form of rows and columns, for example in two superimposed planes, or in the same plane with conductive bridges for intersections.

Depending on the particular embodiment, the device according to the invention may comprise at least one guard component arranged in the form of a surface or a plane placed close to the side of at least one capacitive electrode.

Depending on the particular embodiment, the device according to the invention may comprise at least one guard component biased at a ground voltage.

In other embodiments, the device according to the invention may comprise at least one capacitive electrode excited by an alternating excitation voltage, and at least one guard component biased at an alternating guard voltage identical or substantially identical to said excitation voltage for at least one excitation frequency.

Depending on the sensing modality implemented, the guard voltage may be different from the alternating excitation voltage and may include other components at frequencies that differ from the excitation frequency(ies). In fact, for example, if the capacity measurement comprises a synchronous demodulation at the excitation frequency, these other components are discarded and do not contribute to the sensing.

It may also include, among others:
capacitive excitation and measuring means with a charge amplifier;
capacitive excitation and measuring means at least partly referenced to the guard voltage.

Another aspect proposes an interface device comprising a display screen and a capacitive sensing device according to the invention with a plurality of capacitive electrodes made of a substantially transparent material arranged on or inside said display screen.

Yet another aspect proposes an apparatus comprising an interface device according to the invention.

This apparatus may notably be of the smartphone or tablet type.

DESCRIPTION OF FIGURES AND EMBODIMENTS

Other advantages and features of the invention will become apparent from reading the following detailed description of non-limiting implementations and embodiments, and the accompanying drawings.

Figure 4:
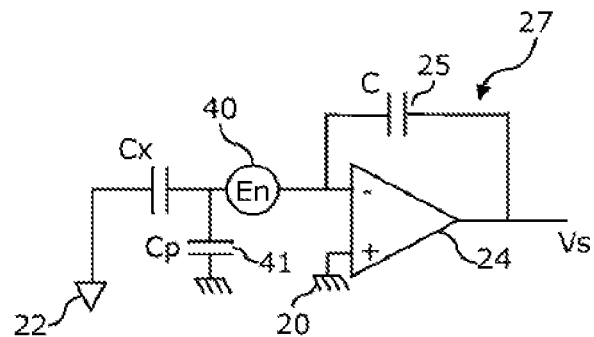
Figures 5A, 5B, 5C, 5D:
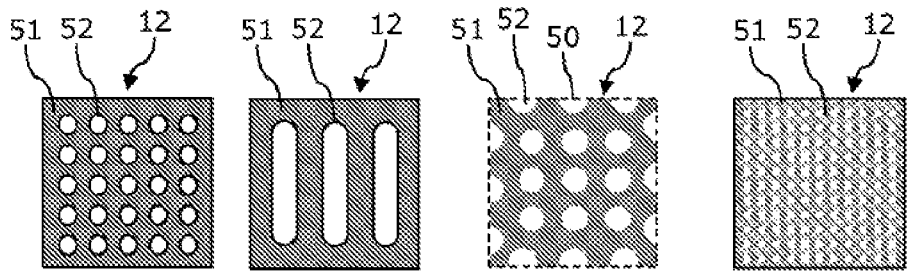
Figure 6A:
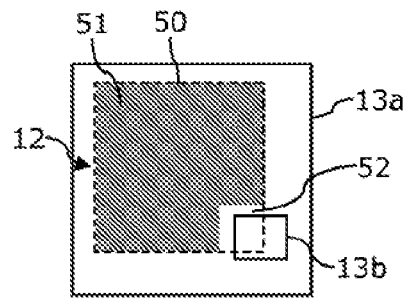
Figure 6B:
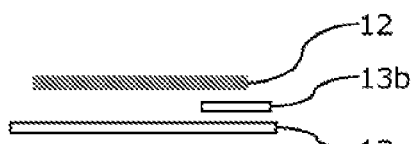
Figure 7A:
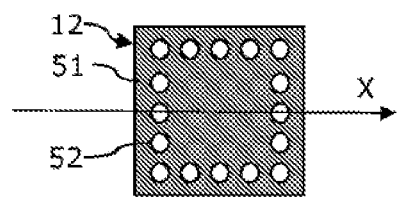
Figure 7B:
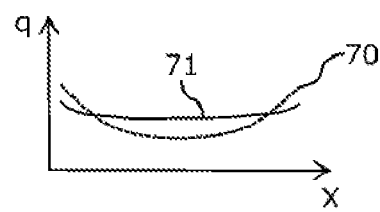

FIG. 4 illustrates the effect of parasitic coupling capacitances to the guard using an equivalent electric circuit, FIG. 5(a) to FIG. 5(d) depict embodiments of electrodes according to the invention, FIGS. 6(a) and 6(b) depict a front view and a side view, respectively, of an embodiment of an electrode according to the invention taking into account the presence of guard components in the immediate vicinity, FIG. 7(a) depicts an electrode according to the invention with a surface density of openings that is higher toward the edges of the conductive surface than towards its center, and FIG. 7(b) depicts a charge density profile through the electrode.

It is obvious that the embodiments that will be described below are in no way limiting. Other aspects of the invention are possible, which comprise only a selection of the features described below, isolated from the other features described, if the selected features are sufficient to provide a technical advantage or to distinguish the invention from the description of the prior art. This selection comprises at least one feature, preferably functional without structural details or with only a portion of the structural details if this portion is sufficient to impart a technical advantage or to distinguish the invention from the description of the prior art.

In particular, all the aspects and embodiments described may be combined with each other if the combination is technically possible.

In the figures, the components that are common to several figures retain the same reference.

Figure 1:
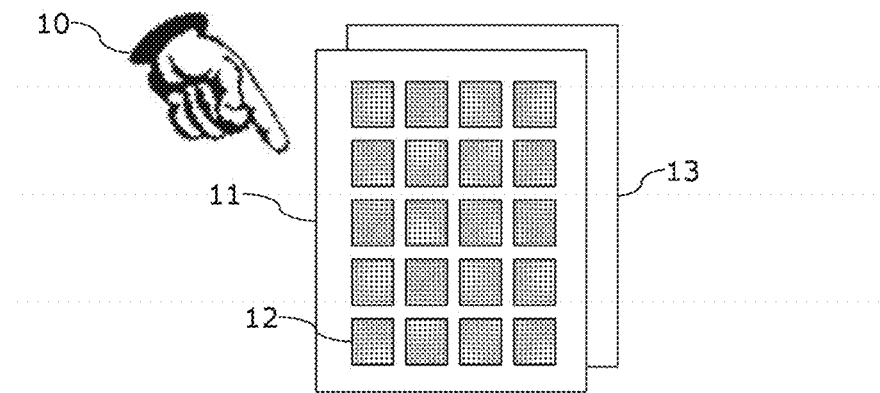
FIG. 1 depicts a capacitive sensing panel according to the invention.

Firstly, with reference to FIG. 1, the configuration of a capacitive measuring device according to the invention that implements capacitive measuring electrodes 12 distributed in a matrix arrangement on a measuring surface or panel 11 will be disclosed.

This configuration is obviously detailed as an example and is in no way limiting.

The capacitive electrodes 12 enable to detect the presence of the objects of interest 10 by capacitive coupling in a detection zone.

Depending on the application, said electrodes enable the measurement of the position of the object(s) of interest 10 relative to the measuring surface 11.

In the embodiment shown, the measuring device further comprises a guard component 13 in the form of a guard surface 13 placed at the side of the measuring electrodes 12 that is opposite to the detection area. This guard surface 13 protects the electrodes 12 from external electrical interferences and particularly prevents the occurrence of stray capacitances.

According to the invention, the electrodes 12 comprise a conductive surface with openings. Various embodiments of these electrodes are detailed further below.

The configuration depicted in FIG. 1 is representative of capacitive measuring devices such as those implemented, for example:

- to obtain proximity or collision sensing systems, in applications for medical imaging equipment with moving parts, or in robotics for instance. In this case, the measuring surface or panel 11 with the guard 13 may be obtained in the form of a flexible or rigid double-sided printed circuit;
- to obtain control interfaces capable to detect contact with the measuring surface, and optionally gestures performed in the sensing area. These control interfaces may be in pad form. They may also be superimposed on or integrated with a display screen, to form touch interfaces for devices such as smartphones or tablets. In this case, the electrodes 12 and the guard components 13 may be made of substantially transparent materials such as ITO.

Figure 2:
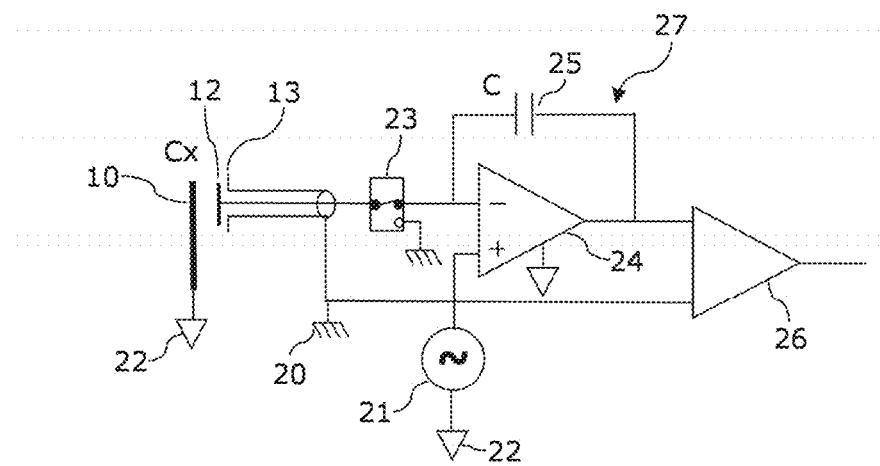
FIG. 2 depicts a first embodiment of a capacitive sensing electronic circuit.
Figure 3:
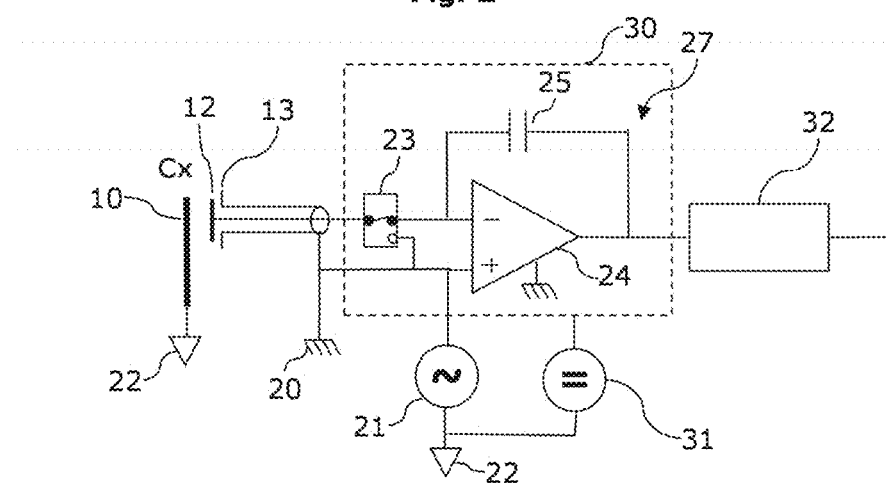
FIG. 3 depicts a second embodiment of a capacitive sensing electronic circuit.

Referring to FIG. 2 and FIG. 3, examples of electronic embodiments of capacitive measurement will now be disclosed.

FIG. 2 depicts a first embodiment of this capacitive measuring electronic circuit.

The electronic circuit implemented in this embodiment is based on a charge amplifier 27 shown in the form of an operational amplifier 24 with a negative feedback capacitance 25.

It enables to measure the capacitance between a control object 10 at the system's general ground voltage 22 and a capacitive measuring electrode 12. As explained above, the value of this capacitance may be used to infer the distance between the object 10 and the measuring electrode 12, for example.

The measuring electrode 12 is connected to the (−) input of the charge amplifier 24.

The (+) input of the charge amplifier 24 is excited by an oscillator 21 which supplies an alternating excitation voltage. The measuring electrode 12 is thus biased at substantially the same excitation voltage.

The output of the charge amplifier 27 is connected to a differential amplifier 26 which provides at output a voltage representative of the capacitances at the input of the charge amplifier 24.

The device further includes guard components 13 intended to protect the measuring electrodes 12 and the components connecting the electrodes 12 and the electronic circuit. These guard components 13 are biased at a guard voltage 20 which substantially corresponds to the excitation voltage generated by the oscillator 21. An active guard is thus generated at substantially the same voltage as the measuring electrodes 12.

The electronic circuit also comprises scanning means or switches 23 which enable to select the electrodes 12. These switches 23 are arranged so that an electrode 12 is either connected to the charge amplifier and is a measuring component, or is connected to the guard voltage 20 to contribute to the guard components 13.

In this embodiment, the capacitive sensing electronic circuit with the charge amplifier 27 and the differential amplifier 26 all use the general ground voltage 22 as a reference.

However, this embodiment has the drawback of allowing the presence of stray capacitances between the electrodes 12 and/or the input of the charge amplifier 27 and components at the general ground voltage 22.

FIG. 3 depicts a second embodiment of this capacitive measuring electronic circuit.

This embodiment also enables to measure the capacitance between a control object 10 at the system's general ground voltage 22 and a capacitive measuring electrode 12. As explained above, the measure of this capacitance may be used to infer the distance between the object 10 and the measuring electrode 12, for example.

In this embodiment, the electronic circuit comprises a so-called "floating" portion 30 which is overall referenced to an alternating reference voltage 20 (or guard voltage 20) generated by an oscillator 21. Thus, stray capacitances may not occur as all the components, including the electrodes 12 and the sensitive part of the sensing electronic circuit, are at the same guard voltage. High sensitivity may thus be obtained and the control objects 10 may be sensed at a long range.

This type of sensing electronic circuit, also known as a circuit with "floating reference" or "floating bridge", is disclosed in detail for example in WO2011/015794 cited above. Also, for brevity, only its essential features are reiterated here.

As in the previous embodiment, the electronic circuit implemented in this embodiment is based on a charge amplifier 27 shown in the form of an operational amplifier 24 with a negative feedback capacitance 25.

The charge amplifier 27, as all the sensitive part of the sensing electronic circuit uses the guard voltage 20 as a reference and is therefore part of the floating portion 30 of the circuit.

This floating portion 30 may obviously comprise other signal processing and conditioning means, including digital or microprocessor-based, which also use the guard voltage 20 as a reference. These processing and conditioning means enable for example the calculation of distance and position information from capacitive measurements.

The power supply of the floating portion 30 is provided by floating power transfer means 31, comprising for example DC/DC converters.

The output of the floating electronic circuit 30 is connected to the electronic circuit of the apparatus using the general ground voltage 22 as a reference by connecting components 32 that are compatible with the difference in reference voltage. These connecting components 32 may comprise for example differential amplifiers or opto-couplers.

In the embodiment shown, the measuring electrode 12 is connected to the (−) input of the charge amplifier 27.

The (+) input of the charge amplifier 27 is excited by an oscillator 21 which supplies an alternating reference voltage 20 or guard voltage 20. The measuring electrode 12 is thus biased at substantially the same reference voltage 20.

The device further includes guard components 13 intended to protect the measuring electrodes 12 and the components connecting the electrodes 12 and the electronic circuit. These guard components 13 are biased at the guard voltage 20 generated by the oscillator 21, which is also the reference voltage of the floating electronic circuit 30.

The device also comprises scanning means or switches 23 which enable to select the electrodes 12. These switches 23 are arranged so that an electrode 12 is either connected to the charge amplifier 27 and is a measuring component, or is connected to the guard voltage 20 to contribute to the guard components 13.

The switches 23 also use the guard voltage 20 as a reference.

In relation to FIG. 4, the influence of parasitic coupling capacitances to the guard in the charge amplifiers 27 of the type implemented in the embodiments disclosed in relation to FIGS. 2 and 3 will now be disclosed.

As explained above, the charge amplifier 27, which may also be regarded as a capacitance-voltage converter, is based on an operational amplifier 24 with a negative feedback capacitance 25 of value C.

It enables the measurement of the capacitance Cx corresponding to the coupling capacitance between a measuring electrode 12 and the object(s) of interest 10.

The capacitance used to measure Cx is excited by a periodic alternating excitation signal (sine, square, etc.), for example generated by the oscillator 21. This excitation signal of amplitude V generates a current I through the capacitance Cx to be measured.

This current I is incident on the (−) input of the operational amplifier 24. Insofar as the input impedance of input of this operational amplifier 24 may be considered to be infinite, and therefore the voltage of the (−) input may be considered to be identical to that of the (+) input, the value of the current I is consequently equal to the current Ic flowing in the negative feedback capacitance 25 of value C. The current I is thus converted into an output voltage Vs (relative to the general ground voltage 22) thanks to the negative feedback capacitance C. The capacitance C and the excitation voltage give the gain of the capacitance-voltage converter. More specifically:

$$Vs = VCx/C.$$

The measurement error notably depends on the ratio of the open-loop gain of the operational amplifier 24 and the closed-loop gain at the excitation frequency.

This method allows for extreme sensitivity, provided that the reference voltage on the (+) input of the amplifier are properly designed to use the excitation voltage as a reference (no parasitic or poorly defined signal injection) and the product gain times amplifier band is properly sized with respect to the frequency of the excitation signal.

However, the natural thermodynamic noise of the charge amplifier limits the resolution.

The analog linear amplifiers have two types of noise: a current noise and a voltage noise. Operational amplifiers with high input impedance are generally of the type FET, JFET, BIFET, DIFET, MOS, MOSFET, CMOS, etc. When this type of component is mounted as a charge amplifier, the current noise is generally negligible compared to the voltage noise.

For the applications under consideration, there is always a parasitic coupling capacitance 41 at the input of the amplifier 24, which is created by the capacitive sensor 12 and the connecting line between the sensor and the electronic circuit. This parasitic capacitance 41, of value Cp, influences the intrinsic characteristics of the amplifier, and more particularly creates a voltage noise gain and degrades the open-loop gain of the amplifier. This gain makes the voltage noise very strong compared to the current noise of the amplifier 24.

The voltage noise at the input of the amplifier is shown in FIG. 4 by a voltage source 40 of amplitude En placed in series with the capacitance to be measured Cx on the (−) input of the amplifier.

The parasitic coupling capacitance Cp brought to the input of the charge amplifier corresponds to a sum of parasitic capacitances in parallel, notably:
- a coupling capacitance Cpe between the electrode 12 and the shield or guard 13 at the guard voltage 20;
- a coupling capacitance Cpl between the path connecting the electrode 12 to the electronic circuit and the shield or guard at the guard voltage 20;
- an input capacitance Cpi of the amplifier 24.

The corresponding voltage noise at the output of the charge amplifier is:

$$Bs = EnCp/C.$$

In our case, the thermodynamic noise generated by the electrical resistance of the connecting path may be ignored. This noise remains usually much lower than the voltage noise En of the amplifier.

The value of the input noise En depends on the characteristics of the amplifier and the reduction in said noise, for example by increasing the bias current, may use power. In practice, for portable applications (touchscreen of a smartphone, tablet, etc.) power use is an important criterion and compromise between this use and noise remains a handicap for applications requiring very high-resolution capacitive measurement.

The parasitic coupling capacitance Cp has also an impact on the product gain times amplifier band. Indeed, the higher the value of Cp, the larger the open-loop bandwidth of the amplifier needed in order to maintain the same excitation frequency of the sensor. However, increasing this bandwidth causes an increase in the power used by the charge amplifier. As explained above, increased use may be critical for portable device applications.

One solution for reducing the voltage noise is to improve the sensitivity of the amplifier by increasing the amplitude of the excitation voltage of the electrode 12. However, as before, power use quickly becomes restrictive. In addition, recent integrated circuit technologies do not accept voltages higher than a few volts.

Another solution to reduce the measurement noise is to reduce the value of the capacitance Cp.

Most of this capacitance stems from the coupling (Cpe+Cpl) between the electrode 12 and its connecting path, on the one hand, and the shield or guard 13, on the other.

The values of these two capacitances Cpe and Cpl are proportional to the product of the area covered by the electrode Se and the connecting path Sl and the permittivity $\in$ of the dielectric between the electrode-path assembly of the guard 13, and inversely proportional to the thickness d of this dielectric:

$$Cpe + Cpl = \in(Se + Sl)/d.$$

For sensors of small dimensions (proximity sensor with integrated electronic circuit, portable touch screen device, etc.), it is often possible to significantly reduce the value of the coupling capacitance of the connecting path Cpl by minimizing the width and length of this connecting path.

In contrast, the area of the electrode 12 depends on metrological parameters and it is more difficult to reduce its size. In fact, constraints often arise regarding the integration surface of the field lines on the target object 10, the sensitivity of the capacitive measurement, the overlap between the surface area of the electrode 12 and the target object 10.

To reduce the capacitance Cpe, the thickness d of the dielectric between the electrode 12 of the guard 13 may also be increased and/or the value of the relative permittivity of this dielectric may be decreased. Nevertheless, the possibilities are often very limited due to constraints with respect to space and the choice of dielectric materials.

According to the invention, a particularly effective solution to reduce the coupling capacitance Cp is to perforate the electrodes 12, or in other words to arrange or introduce openings in the conductive surface of these electrodes 12.

In fact, perforating the electrodes 12 reduces their equivalent surface area Se, which accordingly reduces the parasitic coupling capacitance Cpe.

It is preferable for the size of the openings (for example, the length of their sides or diameter) to be greater than or at least of the same order of magnitude as the distance d between the electrode 12 of the shield or guard 13. In fact, when the size of the openings is substantially smaller than this separation distance d, the area of the openings in the electrostatic plane is not as large as their geometric area. This phenomenon is due to the fact that field lines are struggling to get through small openings when the separation distance d is large compared with the size of the opening.

The decrease in the equivalent surface area Se of the electrode results in a decrease in the sensitivity of the capacitive measurement system, as well as a direct reduction in the noise voltage gain. These two effects offset each other, so that the signal to noise ratio of the capacitive measurement system is substantially maintained.

Moreover, when openings are present, digital simulations show that the parasitic coupling capacitance Cpe decreases faster with the decrease in the equivalent surface area Se than indicated by the calculation of this capacitance Cpe using the plane capacitor formula, as detailed above. Substantial reductions can therefore be achieved in the parasitic coupling capacitance Cpe with more moderate decreases in the equivalent surface area Se, and therefore limited sensitivity losses.

Compared to a full electrode, a perforated electrode according to the invention has the following advantages:
  it maintains the same overall size, and therefore the same characteristics of spatial distribution of field lines;
  it reduces the parasitic capacitance Cp seen by the input of the charge amplifier;
  it enables a reduction in the power used by the charge amplifier by allowing the use of an amplifier with a lower open-loop bandwidth, or enables an increase in the value of the excitation frequency at constant power use;
  it enables the reduction in the noise En with a lower open-loop bandwidth, while limiting power use.

The perforated electrodes according to the invention also have the following advantages:
  they allow to obtain greater transparency, at least on average, for transparent touch surfaces;
  they enable a reduction in the distance d between the electrode 12 and the shield or guard 13 in order to optimize the integration of the sensor in devices where size and thickness are important. This advantage notably concerns transparent touchscreens or solutions integrating the capacitive touch sensor on or into the display ("on-cell" or "in-cell" technologies);
  they allow to obtain extremely fine sensors, notably by using thin layer deposition techniques, or screen printing, vacuum deposition, and so on. The sensor consisting of a stack of electrode layers, dielectric insulation and guard may thus have a micron or even submicron thickness. The increase in the capacitance Cpe due to the very small thickness d of the dielectric is offset by the addition of openings in the electrode;
  they allow an increase in the size of these electrodes at low noise and without using extremely fast amplifiers. This advantage notably concerns industrial applications such as collision avoidance systems that require electrodes of large dimensions. Electrodes of large dimensions may thus be controlled with measuring electronic circuits that are low-cost and integrated.

FIG. 5 depicts examples of embodiments of capacitive electrodes 12 according to the invention.

These electrodes 12 comprise a conductive surface 51, with openings (i.e., areas without conducting material) 52 arranged within this conductive surface 51.

These openings are distributed so that the overall or effective surface area 50 of the electrodes 12 is substantially maintained. This effective surface area 50 corresponds to the surface area of the electrode 12 in the absence of openings. It determines the spatial extent of the electrode 12.

It is important to maintain the effective surface area 50 because it determines the spatial resolution characteristics of the capacitive measurements that may be obtained with the electrode 12, as it determines the structure of the electric field lines which are established between the electrode 12 and its environment (including objects of interest 10).

The effective surface area 50 may generally be regarded as bounded by a convex hull, i.e., without "dents".

It is thus possible to define a ratio between the area of the electrode 12, given by the area of the effective surface 50 and the area of the conductive layer 51.

Preferably, in the context of the invention, a ratio of less than 1.5 is selected. For example, a ratio of 2 may be selected, which means that the area of the conductive surface 51 corresponds to 50% of the area of the electrode 12 or the area of the effective surface 50.

If the electrode 12 is parallel to a guard plane 13, a reduction is obtained in the parasitic coupling capacitance 41 with the guard 13 of the same ratio (for example, 50% with a surface ratio of 2).

The openings 52 may be of different types. They may include, for example:
  openings 52 arranged in the conductive surface 51, as depicted in FIG. 5(a) for circular openings and in FIG. 5(b) for oblong openings;
  openings in the form of notches 52 arranged on the periphery of the conductive surface 51, as depicted in FIG. 5(c). In this case, the contours of the conductive surface 51 and the effective surface 50 do not match, because the effective surface 50 includes these notches 52;

The electrode 12 may also be implemented in mesh or lattice form, as depicted in FIG. 5(d). In this case, the conductive surface 51 is constituted of the conductive components and the openings 52 are constituted by the gaps between these conductive elements.

FIG. 5(a) to FIG. 5(d) depict the electrodes 12 with the openings 52 substantially homogeneously distributed over the overall surface 50 of the electrode. In other words, in these examples, the surface density of the openings (defined as a local ratio between the area of the opening 52 and the area of the conductive surface 51) is substantially homogeneous over the entire surface of the electrode 12.

This homogeneous distribution is suitable for example when the electrodes are substantially parallel to a guard surface 13.

In reference to FIG. 6, since the parasitic coupling capacitance intended to be limited is the overall coupling capacitance of the electrode 12, the openings 52 may advantageously be distributed on the surface of the electrode 12, so that the surface density of the openings is higher in areas where the guard components 13 are closer to the electrode 12 and thus more strongly contribute to the coupling capacitance 41. Thus, the parasitic coupling capacitance 41 to the guard components is thus minimized with a limited reduction in the conductive surface 51, which allows to maintain a high measurement sensitivity.

The surface density of openings may thus be adjusted, for example based on the position of the particular guard components 13 present under the electrode 12.

In the example depicted in FIGS. 6(*a*) and 6(*b*), the guard components 13 comprise a guard plane 13*a* located at a relatively far distance from the electrode 12 and a second guard component 13*b* located close to this electrode and facing only a portion of its surface.

This second guard component 13*b* may be, for example, an electronic component such as a TFT transistor controlling a liquid crystal display, using the guard voltage as a reference, as disclosed in WO2011/015795.

In the example shown, the electrode 12 comprises an opening or notch 52 facing the second guard component 13*b* very closely, and no opening facing the guard plane 13*a* farthest away. Thus the parasitic coupling capacitance 41 to the guard, to which the second guard component 13*b* located very close would strongly contribute, is thus reduced without an excessive reduction in the conductive surface 51.

Obviously, the shape of the openings shown is purely illustrative, and a similar result might be obtained for example with any local modulation suitable to the density of the openings facing the second guard component 13*b* and the guard plane 13*a* (if necessary).

In reference to FIG. 7(*a*), within the scope of the invention it is also possible to adjust the surface density of the openings 52 on the surface of an electrode 12 to obtain a better distribution of electric charges on the conductive surface 51 when an object is located above said electrode. This helps to optimize the measurement linearity of the movement of an object.

In the case of a full electrode without openings 52, the charges tend to accumulate on its edges and the response of a multi-electrode sensor, used for example for interface control applications, is not optimized in terms of linearity, in particular for movements that are parallel to the sensor's surface. In particular, an object that moves above a set of solid electrodes in a straight line (parallel to the sensor's surface) tends to create an undulation in the series of the measured capacities with a pitch equal to the distance between the centers of two consecutive electrodes, even after interpolating the measurements.

Within the scope of the invention, it may also be possible to obtain a very specific charge distribution on the conductive surface 51 for a specific sensitivity distribution or to correct defects due to the presence of connecting paths or any other conductive component in the vicinity of the electrode(s).

For illustrative purposes, FIG. 7(*a*) shows an example of the distribution of openings 52 with a higher opening density toward the periphery of the electrode 12 than toward its center. FIG. 7(*b*) depicts profiles of the charge density q along the X axis of FIG. 7(*a*), respectively for an electrode without openings (plot 70) and for an electrode 12 with a higher density of openings toward the periphery of the electrode 12 than toward its center (plot 71). This produces a more homogeneous charge density profile.

The distribution of opening densities to achieve a better distribution of electric charges may obviously be implemented independently of the issue of reducing the coupling capacitance with the guard 13, at least in terms of optimization. Introducing openings 52 in the electrode obviously also reduces the coupling capacitance with the guard 13.

The invention is obviously not limited to the examples described above and numerous modifications may be made to these examples without exceeding the scope of the invention.

The invention claimed is:

1. A capacitive sensing device, comprising:
    at least one capacitive electrode formed from a substantially conductive material; and
    at least one guard component placed in proximity to the at least one capacitive electrode;
    wherein the at least one guard component includes at least one first opening arranged within or at an edge of the at least one guard component, and the at least one first opening is configured to reduce a coupling capacitance between the at least one capacitive electrode and the at least one guard component.

2. The device of claim 1, wherein the at least one first opening is formed on a surface of the at least one guard component facing the at least one capacitive electrode.

3. The device of claim 1, wherein the at least one capacitive electrode is free of openings.

4. The device of claim 1, wherein the at least one capacitive electrode includes at least one second opening arranged within or at an edge of the at least one capacitive electrode.

5. The device of claim 4, wherein the at least one first opening is arranged to be substantially aligned with the at least one second opening.

6. The device of claim 1, incorporated into a computing device having a display screen, wherein the at least one capacitive electrode is formed from a substantially transparent material.

7. A method for capacitive sensing, comprising:
    forming at least one capacitive electrode from a substantially conductive material;
    placing at least one guard component in proximity to the at least one capacitive electrode;
    forming at least one first opening within or at an edge of the at least one guard component; and
    forming the at least one first opening to reduce a coupling capacitance between the at least one capacitive electrode and the at least one guard component.

8. The method of claim 7, further comprising forming the at least one first opening on a surface of the at least one guard component facing the at least one capacitive electrode.

9. The method of claim 7, further comprising forming the at least one capacitive electrode free of openings.

10. The method of claim 7, further comprising forming at least one second opening within or at an edge of the at least one capacitive electrode.

11. The method of claim 10, further comprising arranging the at least one first opening to be substantially aligned with the at least one second opening.

12. A capacitive sensing device, comprising:
sensing means for detecting an object in proximity to the capacitive sensing device;
guard means in proximity to the sensing means for shielding the sensing means; and
first means, formed within or at an edge of the guard means, for reducing an area of the guard means, wherein the first means are configured for reducing a coupling capacitance between the sensing means and the guard means.

13. The capacitive sensing device of claim 12, wherein the first means are formed on a surface of the guard means facing the sensing means.

14. The capacitive sensing device of claim 12, wherein the sensing means are formed free of openings.

15. The capacitive sensing device of claim 12, further comprising second means within or at an edge of the sensing means for reducing an area of the sensing means.

16. The capacitive sensing device of claim 15, further comprising arranging the first means to be substantially aligned with the second means.

17. The capacitive sensing device of claim 12, incorporated into a handheld computing device comprising a display screen, wherein the second means is formed from a substantially transparent material.

\* \* \* \* \*